United States Patent
Lee et al.

(10) Patent No.: US 7,253,491 B2
(45) Date of Patent: *Aug. 7, 2007

(54) SILICON LIGHT-RECEIVING DEVICE

(75) Inventors: Eun-Kyung Lee, Gyeonggi-do (KR);
Byoung-Lyong Choi, Seoul (KR);
Jun-Young Kim, Gyeonggi-do (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/502,765

(22) PCT Filed: Oct. 16, 2002

(86) PCT No.: PCT/KR02/01932

§ 371 (c)(1),
(2), (4) Date: Jul. 28, 2004

(87) PCT Pub. No.: WO03/067670

PCT Pub. Date: Aug. 14, 2003

(65) Prior Publication Data

US 2005/0073019 A1    Apr. 7, 2005

(30) Foreign Application Priority Data

Feb. 9, 2002    (KR) ................... 2002-7707

(51) Int. Cl.
*H01L 31/06*    (2006.01)
*H01L 27/14*    (2006.01)
*H01L 31/00*    (2006.01)

(52) U.S. Cl. .............. 257/461; 257/431; 257/449; 257/466

(58) Field of Classification Search ........ 257/461, 257/431, 449, 466
See application file for complete search history.

(56) References Cited

U.S. PATENT DOCUMENTS 5,633,526 A * 5/1997 Kudo et al. ........... 257/431

(Continued)

FOREIGN PATENT DOCUMENTS

| GB | 2275820 A | 9/1994 |
|---|---|---|
| JP | 63-56613 A | 3/1988 |
| JP | 2-148769 A | 6/1990 |
| JP | 10-214958 A | 8/1998 |
| JP | 2000-223691 A | 8/2000 |

OTHER PUBLICATIONS

Official Action issued by the Chinese Patent Office on Sep. 29, 2006 in corresponding Chinese Patent Application No. 028278747; and English translation thereof.

*Primary Examiner*—Sara Crane
*Assistant Examiner*—Samuel A. Gebremariam
(74) *Attorney, Agent, or Firm*—Buchanan Ingersoll & Rooney PC

(57) ABSTRACT

A silicon light-receiving device is provided. In the device, a substrate is based on n-type or p-type silicon. A doped region is ultra-shallowly doped with the opposite type dopant to the dopant type of the substrate on one side of the substrate so that a photoelectric conversion effect for light in a wavelength range of 100-1100 nm is generated by a quantum confinement effect in the p-n junction with the substrate. First and second electrodes are formed on the substrate so as to be electrically connected to the doped region. Due to the ultra-shallow doped region on the silicon substrate, a quantum confinement effect is generated in the p-n junction. Even though silicon is used as a semiconductor material, the quantum efficiency of the silicon light-receiving device is far higher than that of a conventional solar cell, owing to the quantum confinement effect. The silicon light-receiving device can also be formed to absorb light in a particular or large wavelength band, and used as a solar cell.

10 Claims, 4 Drawing Sheets

U.S. PATENT DOCUMENTS

| | | |
|---|---|---|
| 5,920,078 A | 7/1999 | Frey |
| 6,060,026 A | 5/2000 | Goldstein |
| 6,157,047 A * | 12/2000 | Fujita et al. ............ 257/51 |
| 6,495,852 B1 * | 12/2002 | Mouri .................... 257/21 |
| 6,677,610 B2 * | 1/2004 | Choi et al. ............... 257/59 |
| 6,697,403 B2 * | 2/2004 | Lee et al. ............. 372/43.01 |
| 6,787,810 B2 * | 9/2004 | Choi et al. ............... 257/82 |
| 6,930,330 B2 * | 8/2005 | Choi et al. ............... 257/87 |
| 2004/0208415 A1 * | 10/2004 | Kim et al. ............... 385/14 |

* cited by examiner

Longitudinal QW

Laternal QW

SILICON LIGHT-RECEIVING DEVICE

BACKGROUND OF THE INVENTION

This application claims the benefit of Korean Patent Application No. 2002-7707, filed on Feb. 9, 2002, in the Korean Intellectual Property Office, the disclosure of which is incorporated herein in its entirety by reference.

1. Field of the Invention

The present invention relates to the field of silicon light-receiving devices, and more particularly, to a silicon light-receiving device having a high quantum efficiency due to a quantum confinement effect.

2. Description of the Related Art

FIG. 1 is a schematic diagram of a solar cell as an example of a silicon light-receiving device. Referring to FIG. 1, a general solar cell has a p-n diode structure in which an n-type semiconductor 1 and a p-type semiconductor 2 are joined to obtain and utilize a photovoltaic effect by which light energy is converted into electric energy. Electrodes 3 and 4 for connecting an external circuit to the n- and p-type semiconductors 1 and 2 are formed on the upper surface of the p-type semiconductor 2 and the bottom surface of the n-type semiconductor 1, respectively.

Referring to FIG. 2, when light is incident upon the p-n diode structure of FIG. 1 and a photon is absorbed into it, a pair of an electron 7a and a hole 7b is generated at both sides of a p-n junction. At this time, the electron 7a moves toward the n-type semiconductor 1 and the hole 7b moves in the opposite direction. Accordingly, when the load resistor 5, which is an external circuit, is connected to the p-n diode structure, according as light energy is converted into electric energy, current I flows through the p-n diode structure.

Typically, silicon is used as the semiconductor material for solar cells as described above. The solar cells having a diode structure using silicon semiconductors provide a low efficiency when converting light energy into electric energy. In theory, single crystal silicon has about 23% photoelectric conversion efficiency, polycrystal silicon has about 18% photoelectric conversion efficiency, and amorphous silicon has about 14% photoelectric conversion efficiency. During actual operation of solar cells using one of the aforementioned types of silicon as semiconductor materials, the photoelectric conversion efficiency decreases more.

SUMMARY OF THE INVENTION

To solve the above-described problem, it is an object of the present invention to provide a silicon light-receiving device providing far higher quantum efficiency than a conventional solar cell because of a quantum confinement effect generated at a p-n junction even though silicon is used as a semiconductor material.

To achieve the object, embodiments of the present invention provide a silicon light-receiving device including a substrate, a doped region, and first and second electrodes. The substrate is based on n-type or p-type silicon. The doped region is doped to an ultra-shallow depth with the opposite type dopant to the dopant type of the substrate on one side of the substrate. Thus, a photoelectric conversion effect for light in a wavelength range of 100-1100 nm is generated by a quantum confinement effect in the p-n junction with the substrate. The first and second electrodes are formed on the substrate so as to be electrically connected to the doped region.

Preferably, micro-cavities of various sizes are formed so that the silicon light-receiving device is used as a solar cell for absorbing light of various wavelengths in the range of 100 to 1100 nm.

It is also preferable that the silicon light-receiving device further includes a control film formed on one side of the substrate. The control film serves as a mask when the doped region is formed and helping the doped region to be formed to the ultra-shallow depth.

The control film may be formed of silicon oxide $SiO_2$ to a proper thickness that enables the doped region to be formed to the ultra-shallow depth.

Preferably, the doped region is formed by non-equilibrium diffusion of the dopant. The dopant may be one of boron and phosphorus.

It is also preferable that at least one of a quantum well, a quantum dot, and a quantum wire, in each of which electron-hole pairs are created, is formed at the p-n junction of the doped region with the substrate.

Preferably, the sub-band energy levels within at least one of the quantum well, the quantum dot, and the quantum wire are changed by the application of external voltage so that an absorption light wavelength band is changed.

The substrate may be formed of one of Si, SiC, and diamond.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 3:
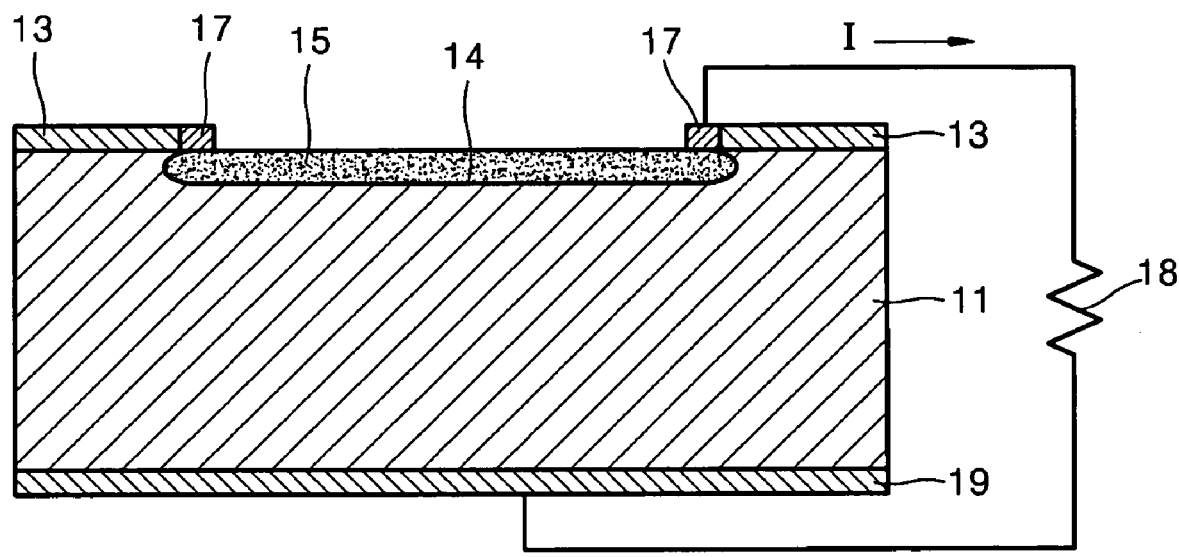
FIG. 3 is a schematic diagram of a silicon light-receiving device according to an embodiment of the present invention.

Referring to FIG. 3, a silicon light-receiving device according to an embodiment of the present invention includes a substrate 11, a doped region 15 formed on one side of the substrate 11, and first and second electrodes 17 and 19 formed on the substrate 11 so as to be electrically connected to the doped region 15. Preferably, the silicon light-receiving device according to embodiments of the present invention further includes a control film 13 formed on one side of the substrate 11 in order to serve as a mask upon formation of the doped region 15 and control the doped region 15 to be formed to a desired ultra-shallow thickness. The control film 13 can be selectively removed after the doped reaion 15 is formed.

The substrate 11 is formed of a semiconductor material including silicon (Si), for example, Si, silicon carbide (SiC), or diamond, and doped with n-type dopant.

The doped region 15 is doped with the opposite type dopant to the substrate 11, i.e., p+ type dopant, by implanting a dopant (e.g., boron or phosphorous) through the opening of the control film 13 into the substrate 11 using the non-equilibrium diffusion technique.

Preferably, the doped region 15 is doped to a desired ultra-shallow depth so that at least one of a quantum well, a quantum dot, and a quantum wire is formed at the boundary between the doped region 15 and the substrate 11, that is, at the p-n junction 14 and a consequent quantum confinement effect enables light with a wavelength ranging from 100 to 1000 nm, preferably, from 200 to 900 nm, to be converted into electric energy with a high quantum efficiency.

Here, a quantum well is generally formed at the p-n junction 14. Alternatively, either a quantum dot or a quantum wire can be formed at the p-n junction 14. Two or more of the quantum well, the quantum dot, and the quantum wire can also be formed at the p-n junction 14. Hereinafter, the case where a quantum well is formed at the p-n junction 14 will be described for simplicity. Accordingly, even though it is described hereinafter that a quantum well is formed at the p-n junction 14, it must be considered that at least one of the quantum well, the quantum dot, and the quantum wire is formed.

Figure 4A:
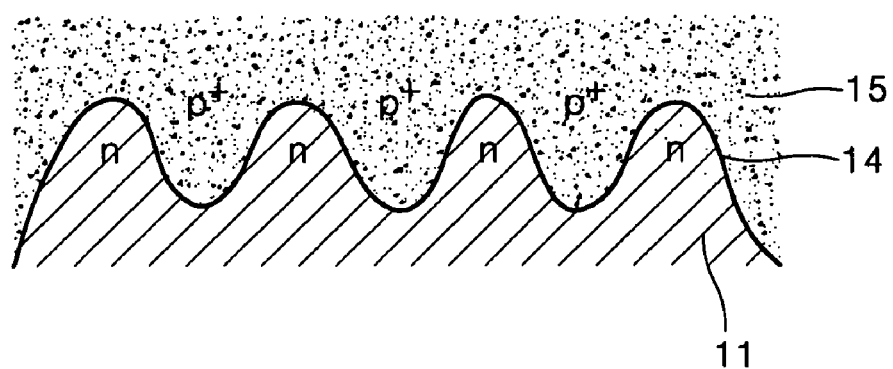
FIG. 4A shows the structure of a p-n junction when a doped region is formed very thinly by non-equilibrium diffusion.
Figure 4B:
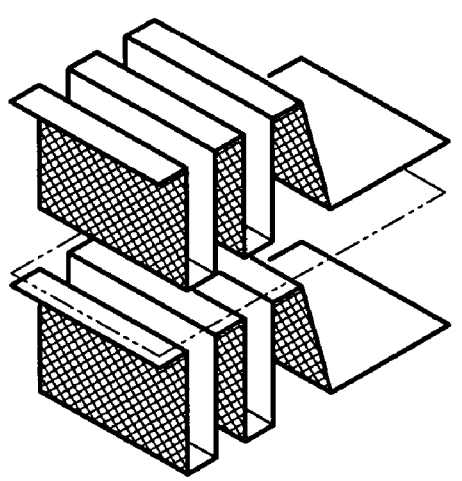
FIG. 4B shows the energy bands of longitudinal and lateral quantum wells (QW) formed at the p-n junction of FIG. 4A by non-equilibrium diffusion.
Figure 4B:
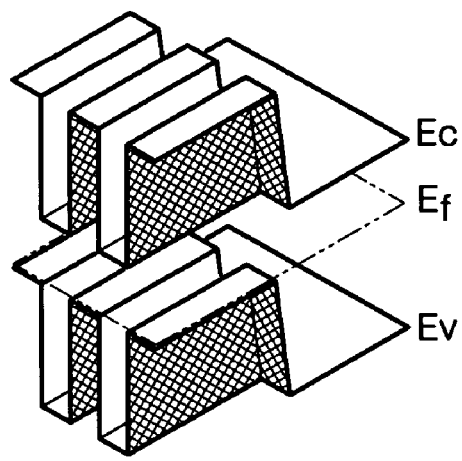

FIG. 4A shows the structure of the p-n junction 14 when the doped region 15 is formed to an ultra-shallow depth by non-equilibrium diffusion. FIG. 4B shows the energy bands of longitudinal and lateral quantum wells (QW) formed at the p-n junction 14 of FIG. 4A by non-equilibrium diffusion. In FIG. 4B, reference character Ec denotes a conduction band energy level, reference character Ev denotes a valence band energy level, and reference character Ef denotes a Fermi energy level. These energy levels are well known in the field of semiconductor-related technology, so they will not be described in detail.

As shown in FIGS. 4A and 4B, the p-n junction 14 has a quantum well structure in which different doped layers alternate. Here, a well and a barrier are approximately 2 nm, 3 nm.

Such ultra-shallow doping to form a quantum well at the p-n junction 14 can be achieved by optimally controlling the thickness of the control film 13 and the conditions of diffusion.

During diffusion, the thickness of a diffusion profile can be controlled to, for example, 10-20 nm, by an appropriate diffusion temperature and the deformed potential of the surface of the substrate 11. In such an ultra-shallow diffusion profile, a quantum well system is created. Here, the potential of the surface of the substrate 11 is deformed by the thickness of the control film 13 at its initial stage and a surface pretreatment, and the deformation becomes worse as diffusion progresses.

Preferably, the control film 13 is a silicon oxide film SiO2 having a proper thickness that enables the doped region 15 to be formed to an ultra-shallow depth. For example, the control film 13 is formed to have a mask structure by forming a silicon oxide film on one side of the substrate 11 and etching the silicon oxide film using photolithography to obtain an opening for diffusion.

As well known in the field of diffusion technologies, if the silicon oxide film is thicker than the proper thickness (for example, several thousand Å) or a diffusion temperature is low, vacancy mainly affects diffusion and deep diffusion occurs. If the silicon oxide film is thinner than the proper thickness or a diffusion temperature is high, Si self-interstitial mainly affects diffusion and deep diffusion occurs. Accordingly, when the silicon oxide film is formed to a proper thickness that enables Si self-interstitial and vacancy to be created at similar percentages, the Si self-interstitial and vacancy are combined together so that diffusion of a dopant is counteracted. Thus, ultra-shallow doping is possible. The physical properties of the Si self-interstitial and vacancy are well known in the technical field relating to diffusion, so they will not be described in detail.

Alternatively, the substrate 11 may be doped with p-type dopant, and the doped region 15 may be doped with n+-type dopant.

For connection with an external circuit, the first electrode 17 is formed on the upper surface of the substrate 11 on which the doped region 15 is formed, and the second electrode 19 is formed on the bottom surface of the substrate 11. FIG. 3 shows an example where the first electrode 17 is formed of an opaque metal so as to partially contact the outer side of the doped region 15. The first electrode 17 can be formed of a transparent electrode material, such as indium tin oxide (ITO), on the entire surface of the doped region 15.

Figure 5:
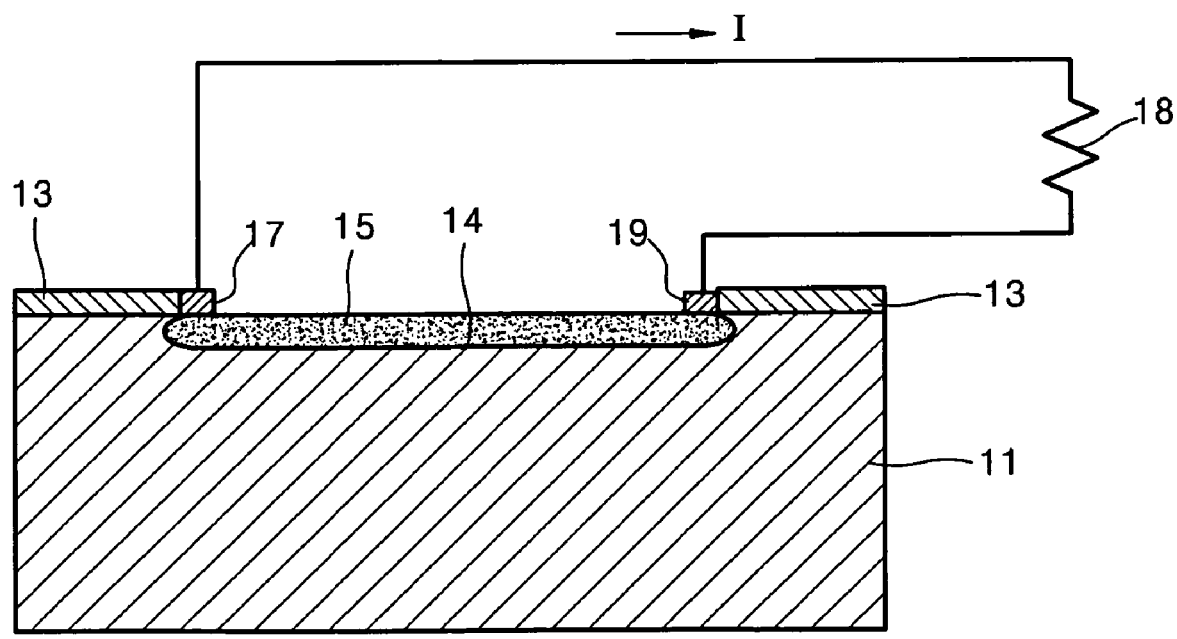
FIG. 5 is a schematic diagram of a silicon light-receiving device according to another embodiment of the present invention.

Instead of forming the second electrode 19 on the bottom surface of the substrate 11, the first and second electrodes 17 and 19 can be formed on the side of the substrate 11 that has the doped region 15, as shown in FIG. 5. The same reference numerals of FIG. 5 as those of FIG. 3 refer to the same elements actually performing the same functions, so they will not be described again.

Figure 6:
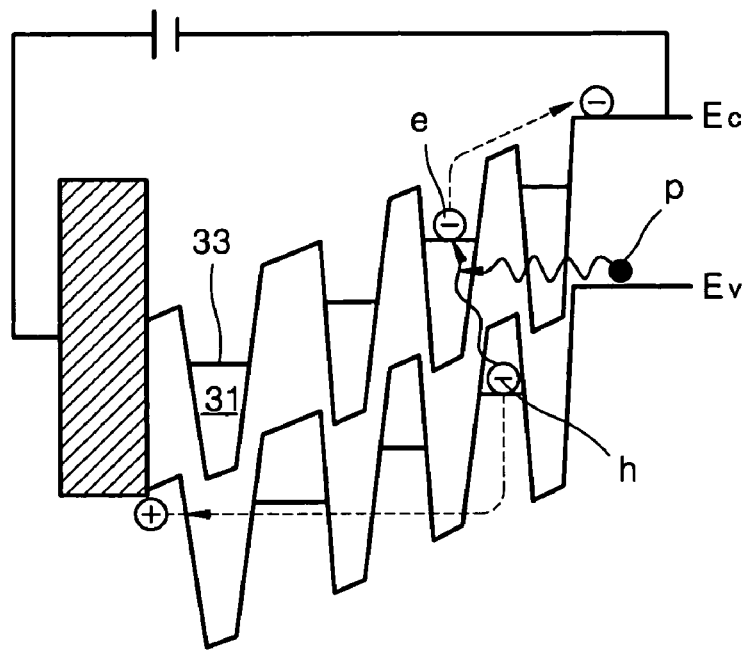
FIG. 6 shows the photoelectric conversion principle in a silicon light-receiving device according to an embodiment of the present invention.

In a silicon light-receiving device according to the present invention as described above, a quantum well is formed at the p-n junction 14 between the doped region 15 and the substrate 11. As shown in FIG. 6, the quantum well absorbs incident light to generate a pair of an electron and a hole. In FIG. 6, reference numeral 31 denotes a quantum well, reference numeral 33 denotes a sub-band energy level, reference character "e" denotes an electron, reference character "h" denotes a hole, and reference character "p" denotes a photon. Also, a reference character Ev denotes a valence band energy level, and a reference character Ec denotes a conduction band energy level.

As shown in FIG. 6, when light is incident upon the p-n junction 14 and the p-n junction 14 with a quantum well structure absorbs the photon p, the electron e and the hole h are each excited to the sub-band energy level within the quantum well formed at the p-n junction 14. Accordingly, if an external circuit, such as a load resistor 18 of FIGS. 3 and 5, is connected, current proportional to the amount of radiated light flows.

The wavelength of absorption in such a silicon light-receiving device according to exemplary embodiments of the present invention is determined according to micro-cavities due to micro-defects generated on the surface of the substrate 11 (actually on the surface of the doped region 14). By adjusting the size of the micro-cavity based on the manufacturing process, the absorption wavelength in the silicon light-receiving device according to the present invention may be determined to be a particular wavelength existing in the range of 100-1100 nm or may vary.

When micro-cavities are formed to have a uniform size, the silicon light-receiving device according to the present invention absorbs light with a specific wavelength and converts the absorbed light into electric energy. When the micro-cavities have various sizes, the silicon light-receiving device according to the present invention absorbs light of a large wavelength band, such as, a range of 100-1100 nm corresponding to the absorption range of a general solar cell, preferably, a wavelength band of 200-900 nm, and converts the absorbed light into electric energy.

The micro-cavities are created from deformed potential due to micro-defects formed on the surface of the doped region 14. Hence, a quantum well can be deformed by adjusting the deformed potential, and consequently the micro-cavities are determined. Accordingly, the sizes of the micro-cavities are controlled to cause absorption in the specific or large wavelength band.

As a result, a silicon light-receiving device according to the present invention is formed to have micro-cavities of uniform size, so that it can be used to detect light with a particular wavelength.

In addition, the silicon light-receiving device according to the present invention is formed to have micro-cavities of various sizes that can absorb light with a large wavelength band including the absorption wavelength band of a general solar cell, such as 100-1100 nm, preferably, 200-900 nm, so that it can be used as a solar cell.

Figure 7:
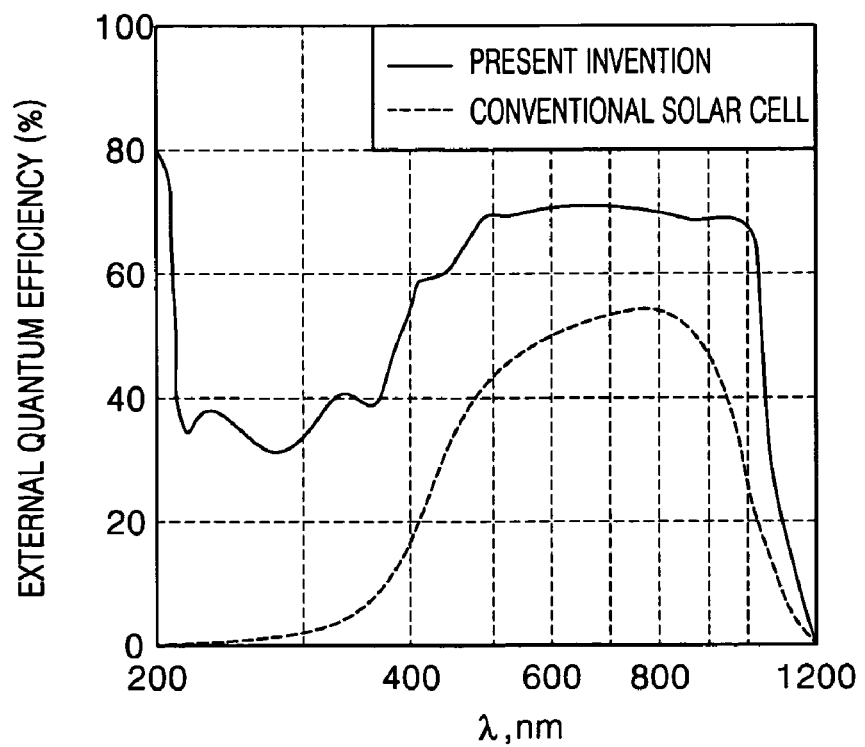
FIG. 7 is a graph showing a comparison of the external quantum efficiency (EQE) of a conventional solar cell using single crystal silicon semiconductors with the EQE of a silicon light-receiving device according to the present invention, when it serves as a solar cell.

FIG. 7 is a graph showing a comparison of the external quantum efficiency (EQE) of a conventional solar cell using single crystal silicon semiconductors with the EQE of a silicon light-receiving device according to the present invention, when it serves as a solar cell. Referring to FIG. 7, in the wavelength band of 200-900 nm, the average EQE of the silicon light-receiving device according to the present invention is about 50-60%, while the conventional solar cell formed of single crystal silicon has an EQE of no more than 35%. Here, the wavelength band of 200-900 nm is generally used to calculate the efficiency of a solar cell.

As can be seen from FIG. 7, in case that a silicon light-receiving device according to the present invention is manufactured to serve as a solar cell, the efficiency of the silicon light-receiving device according to the present invention is much greater than that of a conventional solar cell.

To be more specific, in a conventional solar cell where a doped region is formed on a silicon substrate using a general doping method, light is absorbed and scattered on a p-type or n-type doped layer and accordingly cannot be annihilated by an electron-hole pair that is output to a vertical electrode and contributes to a response. Also, the conventional solar cell has an indirect band gap structure in which only light absorbed by a depletion layer under the doped layer is detected as a current signal without quantum effect, thus providing low detection efficiency.

On the other hand, the ultra-shallow doped region 15 of the silicon light-receiving device according to the present invention generates a quantum confinement effect due to a local change in a charge distribution potential, thus providing high quantum efficiency. In particular, as shown in FIG. 6, the sub-band energy level 33 is formed within the quantum well 31, so that light can be detected with high efficiency.

The silicon light-receiving device according to the present invention having the ultra-shallow doped region 15 provides an excellent sensitivity, for example, in a light wavelength band of 100-1100 nm.

In addition, the silicon light-receiving device according to the present invention can move the entire absorption wavelength band by changing the sub-band energy level of a quantum well according as external voltage is applied.

Figure 1:
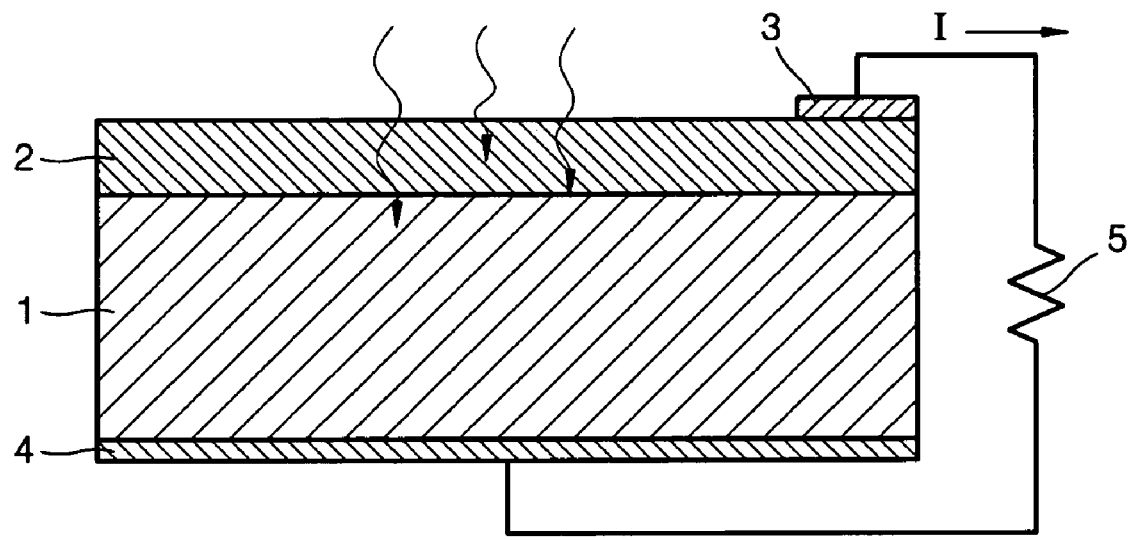
FIG. 1 is a schematic diagram of a solar cell as an example of a conventional silicon light-receiving device.
Figure 2:
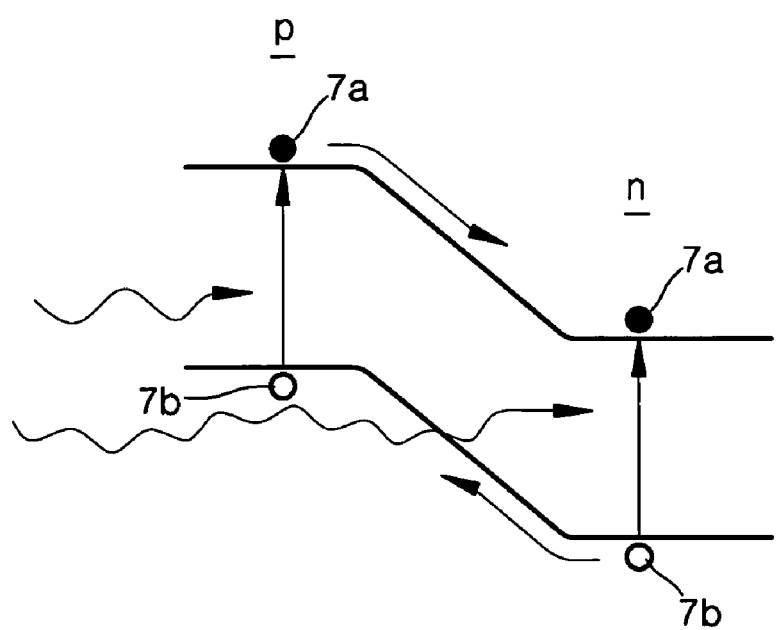
FIG. 2 is a schematic diagram of the photoelectric conversion principle in the p-n diode structure of FIG. 1.

To be more specific, voltage can be applied to the first and second electrodes 17 and 19 in order to control the interval between sub-band energy levels within a quantum well formed at the p-n junction 14. If the first and second electrodes 17 and 19 are formed as shown in FIG. 2, voltage can be vertically applied. If the first and second electrodes 17 and 19 are formed as shown in FIG. 5, voltage can be horizontally applied.

As described above, when the silicon light-receiving device according to the present invention is subjected to horizontal or vertical voltage, the sub-band energy levels within the quantum well formed at the p-n junction 14 can be changed to move the entire absorption wavelength band.

A silicon light-receiving device according to the present invention as described above has an ultra-shallow doped region on a silicon substrate, so that a quantum confinement effect is generated at a p-n junction even though silicon is used as a semiconductor material. Owing to the quantum confinement effect, the quantum efficiency of the silicon light-receiving device according to the present invention is far higher than that of a conventional solar cell.

Such a silicon light-receiving device according to the present invention can be formed to absorb light in a particular or large wavelength band, and used as a solar cell.

In addition, the silicon light-receiving device according to the present invention can move the absorption wavelength band by changing the sub-band energy level within at least one of a quantum well, a quantum dot, and a quantum wire according as external voltage is applied.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A silicon light-receiving device comprising:
a substrate based on n-type or p-type silicon;
a doped region doped to an ultra-shallow depth with the opposite type dopant to the dopant type of the substrate on one side of the substrate, wherein the death is selected so that a photoelectric conversion effect for light in a wavelength range of 100-1100 nm is generated by a quantum confinement effect in the p-n junction with the substrate; and
first and second electrodes formed on the substrate so as to be electrically connected to the doped region.

2. The silicon light-receiving device of claim 1, wherein micro-cavities of various sizes are formed so that the silicon light-receiving device is used as a solar cell for absorbing light of various wavelengths in the range of 100 to 1100 nm.

3. The silicon light-receiving device of claim 2, further comprising a control film formed on one side of the substrate, the control film serving as a mask when the doped region is formed and helping the doped region to be formed to the ultra-shallow depth.

4. The silicon light-receiving device of claim 1, further comprising a control film formed on one side of the substrate, the control film serving as a mask when the doped region is formed and helping the doped region to be formed to the ultra-shallow depth.

5. The silicon light-receiving device of claim 3, wherein the control film is formed of silicon oxide $SiO_2$ to a proper thickness that enables the doped region to be formed to the ultra-shallow depth.

6. The silicon light-receiving device of claim 1, wherein the doped region is formed by non-equilibrium diffusion of the dopant.

7. The silicon light-receiving device of claim 6, wherein the dopant includes one of boron and phosphorus.

8. The silicon light-receiving device of claim 1, wherein at least one of a quantum well, a quantum dot, and a quantum wire, in each of which electron-hole pairs are created, is formed at the p-n junction of the doped region with the substrate.

9. The silicon light-receiving device of claim 8, wherein the sub-band energy levels within at least one of the quantum well, the quantum dot, and the quantum wire are changed by the application of external voltage so that an absorption light wavelength band is changed.

10. The silicon light-receiving device of claim 1, wherein the substrate is formed of one of Si, SiC, and diamond.

* * * * *